(12) United States Patent
Pak et al.

(10) Patent No.: US 7,868,955 B2
(45) Date of Patent: Jan. 11, 2011

(54) LIQUID CRYSTAL DISPLAY AND METHOD FOR MANUFACTURING THE SAME

(75) Inventors: Sang-Jin Pak, Yongin-si (KR); Young-Ok Cha, Gwangmyeong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 251 days.

(21) Appl. No.: 12/261,502

(22) Filed: Oct. 30, 2008

(65) Prior Publication Data
US 2009/0244418 A1      Oct. 1, 2009

(30) Foreign Application Priority Data
Apr. 1, 2008      (KR) ...................... 10-2008-0030435

(51) Int. Cl.
*G02F 1/1343*     (2006.01)
(52) U.S. Cl. ...................................................... 349/39
(58) Field of Classification Search ........................ None
See application file for complete search history.

(56) References Cited

U.S. PATENT DOCUMENTS

| 2009/0168005 A1* | 7/2009 | Kim et al. .................... 349/144 |
| 2009/0279010 A1* | 11/2009 | Kim ............................ 349/46 |
| 2010/0009478 A1* | 1/2010 | Yang et al. .................... 438/30 |

* cited by examiner

*Primary Examiner*—Sung H Pak
(74) *Attorney, Agent, or Firm*—F. Chau & Associates, LLC

(57) ABSTRACT

A liquid crystal display includes a substrate, a plurality of gate lines formed on the substrate, a plurality of data lines intersecting the gate lines, a plurality of common voltage lines formed in the same layer as the data line and parallel to the data lines and transmitting a common voltage, a plurality of thin film transistors connected to the gate lines and the data lines, and a plurality of pixel electrodes respectively connected to the thin film transistors, arranged in a matrix shape, each of the plurality of pixels including a first edge parallel to the gate lines and a second edge having a shorter length than the first edge and neighboring the first edge.

25 Claims, 19 Drawing Sheets

LIQUID CRYSTAL DISPLAY AND METHOD FOR MANUFACTURING THE SAME

CROSS-REFERENCE TO RELATED APPLICATION

This application claims priority to and the benefit of Korean Patent Application No. 10-2008-0030435 filed in the Korean Intellectual Property Office on Apr. 1, 2008, the entire contents of which are herein incorporated by reference.

BACKGROUND OF THE INVENTION (a) Field of the Invention

Embodiments of the present invention relate to a liquid crystal display and a manufacturing method thereof.

(b) Description of Related Art

Liquid crystal displays (LCDs) are a type of flat panel display (FPD) comprising two display panels on which field generating electrodes are formed, and a liquid crystal layer interposed between the two display panels. A voltage applied to the field generating electrodes generates an electric field on the liquid crystal layer, and the orientation of liquid crystal molecules of the liquid crystal layer is determined and the polarization of incident light is controlled through the generated electric field to display an image.

Among the LCDs, a vertical alignment (VA) mode LCD, which aligns LC molecules such that the long axes of the LC molecules are perpendicular to the panels in the absence of an electric field, exhibits a high contrast ratio and a wide reference viewing angle.

Also, LCDs may be categorized depending on a light source. For example, a transmissive (backlit) LCD displays images using an inner light source, a reflective LCD displays images using natural light from the outside, and a transflective LCD includes a reflective region and a transmissive region as a combination of the backlit LCD and the reflective LCD.

The transflective LCD operates in a backlit mode (transmission mode) in which images are displayed by using an internal light source of the LCD in a dark area where there is insufficient external light, and operates in a reflective mode in which images are displayed by reflecting the external light in an environment with high intensity external illumination.

The LCD includes switching elements connected to each pixel electrode and a plurality of signal lines such as gate lines and data lines to apply voltages to the pixel electrodes by controlling the switching elements. The gate lines transmit gate signals generated by a gate driving circuit, the data lines transmit data voltages generated by a data driving circuit, and the switching elements transmit the data voltages to the pixel electrodes according to the gate signals.

In one configuration, the gate driving circuit may be formed with the same process as when the switching elements of the pixels are integrated on the display panel, and the pixels are arranged in a transverse horizontal direction such that a number of gate lines is increased by three times and the number of the data lines is decreased by one-third thereby reducing the cost while maintaining the same resolution.

However, in a structure including pixel electrodes arranged in the transverse direction, the design of the pixel electrodes is limited in the vertical alignment (VA) mode LCD or the transflective LCD. Also, a kick-back voltage due to a parasitic capacitance between a gate electrode and a source electrode is large according to the change of the gate signals such that the display characteristics are deteriorated.

SUMMARY OF THE INVENTION

A liquid crystal display according to an exemplary embodiment of the present invention includes a substrate, a plurality of gate lines formed on the substrate, a plurality of data lines intersecting the gate lines, a plurality of common voltage lines formed in a layer of the liquid crystal display including the data lines and substantially parallel to the data lines, a plurality of thin film transistors connected to the gate lines and the data lines, and a plurality of pixel electrodes respectively connected to the thin film transistors, arranged in a matrix shape, and each of the plurality of pixels including a first edge substantially parallel to the gate lines and a second edge having a shorter length than the first edge and neighboring the first edge.

The common voltage lines may include an expansion electrode overlapping at least a portion of the pixel electrode.

The expansion electrode may overlap a portion of one side of the pixel electrode.

The expansion electrode may overlap an edge portion of the pixel electrode.

A portion of the expansion electrode may be disposed between pixel electrode and a neighboring pixel electrode.

The gate line may transverse the pixel electrode in a row direction.

The common voltage lines may include a cover electrode covering a portion of the gate line.

The liquid crystal display may further include a storage electrode formed in a layer of the liquid crystal display including the gate line, and receiving a data voltage from the thin film transistors.

The common voltage lines may include an expansion electrode simultaneously overlapping the storage electrode and the pixel electrode.

The liquid crystal display may further include a gate insulating layer formed between the storage electrode and the common voltage lines, and a passivation layer formed on the thin film transistor, wherein the thin film transistor includes a gate electrode connected to the gate line, a source electrode connected to the data line, and a drain electrode connected to the pixel electrode.

The gate insulating layer and the passivation layer may include a first contact hole exposing a portion of the storage electrode, the passivation layer may include a second contact hole exposing a portion of the drain electrode, the pixel electrode may receive the data voltage from the drain electrode through the second contact hole, and the storage electrode may receive the data voltage from the pixel electrode through the first contact hole.

The gate insulating layer may include a first contact hole exposing a portion of the storage electrode, the passivation layer may include a second contact hole exposing a portion of the drain electrode and overlapping the first contact hole, the pixel electrode may receive the data voltage from the drain electrode through the second contact hole, and the storage electrode may receive the data voltage from the drain electrode through the first contact hole The gate insulating layer and the passivation layer may include a contact hole simultaneously exposing portions of the drain electrode and the storage electrode, and the pixel electrode and the storage electrode may receive the data voltage from the drain electrode through the contact hole.

The liquid crystal display may further include a gate driver connected to the gate line.

The gate driver may include a plurality of electrical elements disposed in a layer of the liquid crystal display including the gate lines, the data lines, and the thin film transistors.

The pixel electrode may further comprise a common electrode facing the pixel electrode, wherein the pixel electrode comprises a transparent electrode; and a reflective electrode formed on the transparent electrode and having an opening exposing the transparent electrode.

The liquid crystal display may further include a first passivation layer formed under the transparent electrode, wherein the surfaces of the first passivation layer and the pixel electrode are uneven.

The first passivation layer may include an organic material.

The liquid crystal display may further include a second passivation layer formed under the first passivation layer.

The liquid crystal display may further include an upper substrate facing the substrate, a common electrode formed on the upper substrate, and a liquid crystal layer interposed between the substrate and the upper substrate and including liquid crystal molecules, wherein the pixel electrode or the common electrode includes an inclination direction determining member that determines an inclination direction of the liquid crystal molecules.

A manufacturing method of a liquid crystal display according to an exemplary embodiment of the present invention includes forming a gate conductor including a gate line and a storage electrode on a substrate, sequentially forming a gate insulating layer and a semiconductor layer on the gate conductor, forming a data conductor including a data line, a drain electrode and a common voltage line substantially parallel to the data line and intersecting the gate line on the semiconductor layer, forming a passivation layer on the data conductor, etching the passivation layer and the gate insulating layer to form at least one contact hole exposing the storage electrode and the drain electrode, and forming a pixel electrode on the passivation layer.

The contact hole may include a first contact hole exposing the storage electrode and a second contact hole exposing the drain electrode and separate from the first contact hole, the first contact hole may be formed in the gate insulating layer, and the second contact hole may be formed in the gate insulating layer and the passivation layer.

The contact hole may include a first contact hole exposing the storage electrode and a second contact hole exposing the drain electrode and overlapping the first contact hole, the first contact hole may be formed in the gate insulating layer, and the second contact hole may be formed in the passivation layer.

The contact hole may simultaneously expose the storage electrode and the drain electrode.

The forming of the passivation layer may include forming an organic layer which is uneven, and the forming of the pixel electrode may include forming a transparent electrode and forming a reflective electrode on the transparent electrode, wherein the reflective electrode exposes a portion of the transparent electrode.

DETAILED DESCRIPTION OF EXEMPLARY EMBODIMENTS

Figure 1:
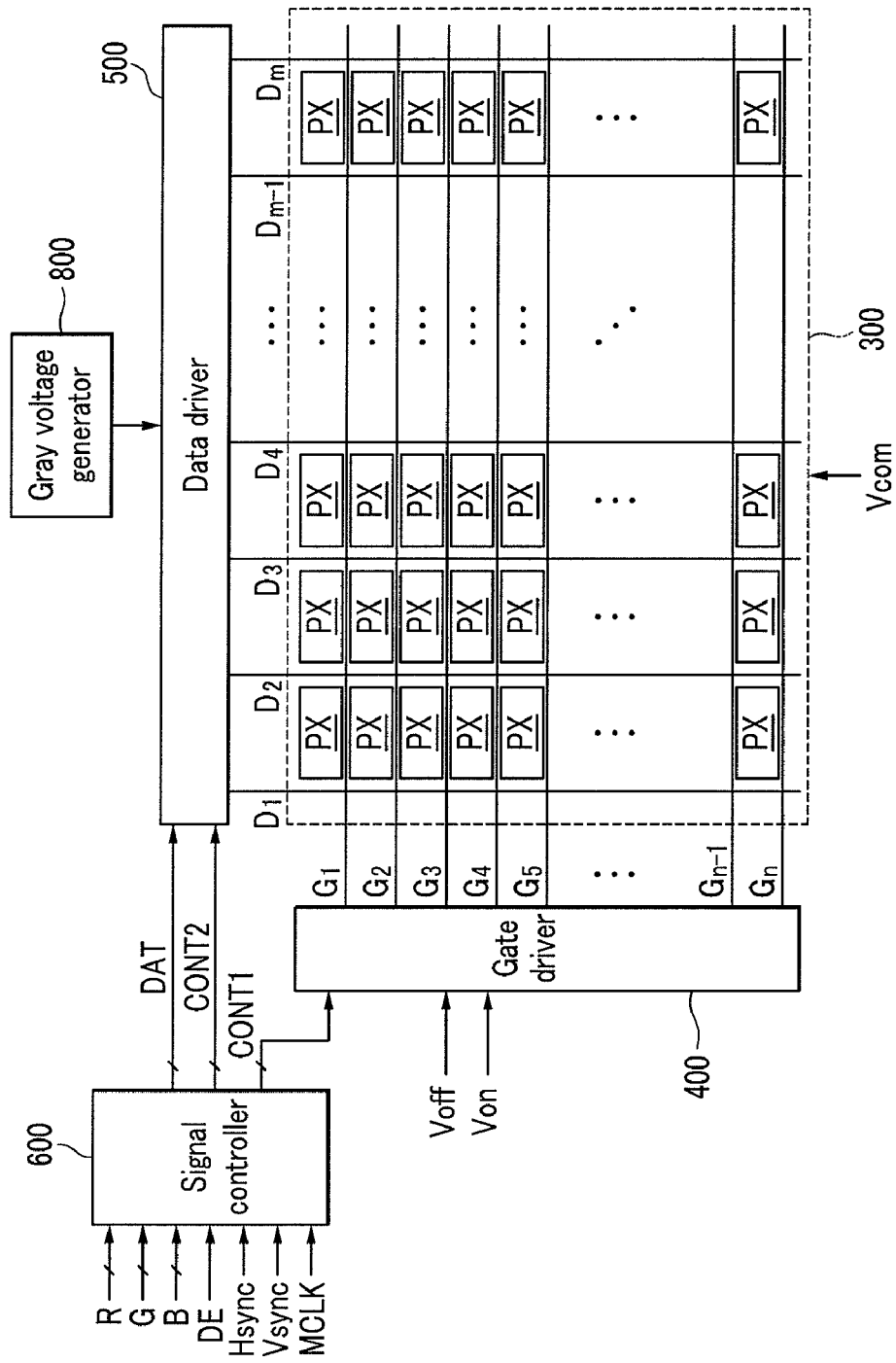
FIG. 1 is a block diagram of a liquid crystal display according to an exemplary embodiment of the present invention.

Exemplary embodiments of the present invention will be described more fully hereinafter with reference to the accompanying drawings. As those skilled in the art would realize, embodiments may be modified in various different ways, without departing from the spirit or scope of the disclosure.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a liquid crystal display according to an exemplary embodiment of the present invention will be described with reference to FIG. 1 and FIG. 2.

Figure 2:
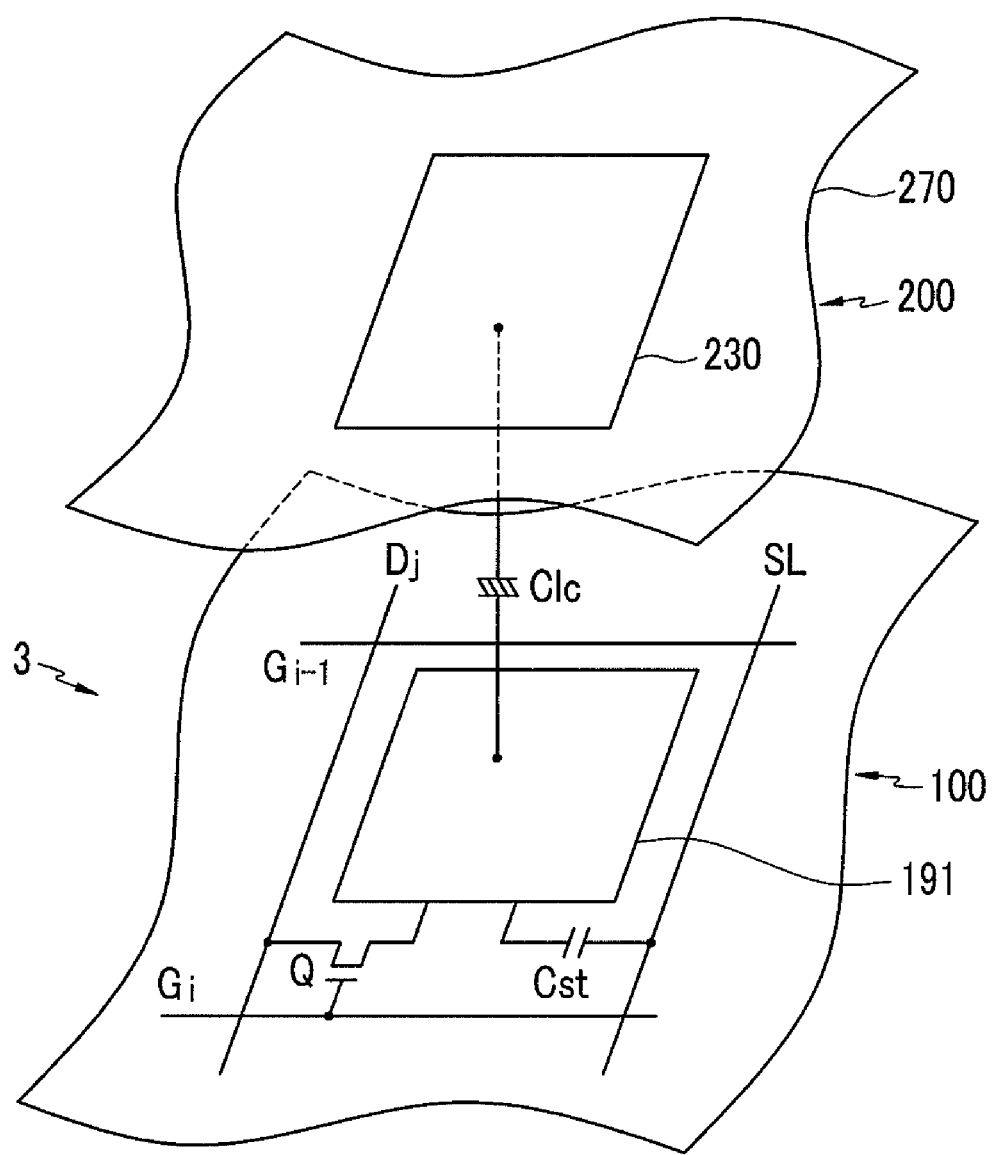
FIG. 2 is an equivalent circuit diagram of one pixel in a liquid crystal display according to an exemplary embodiment of the present invention.

FIG. 1 is a block diagram of a liquid crystal display according to an exemplary embodiment of the present invention, and FIG. 2 is an equivalent circuit diagram of one pixel in a liquid crystal display according to an exemplary embodiment of the present invention.

As shown in FIG. 1, a liquid crystal display according to an exemplary embodiment of the present invention includes a liquid crystal panel assembly 300, a gate driver 400, a data driver 500, a gray voltage generator 800 connected to the data driver 500, and a signal controller 600 for controlling the gate driver 400 and the data driver 500.

In an equivalent circuit, the liquid crystal panel assembly 300 includes a plurality of signal lines $G_1$-$G_n$, $D_1$-$D_m$, and SL, and a plurality of pixels PX that are connected to the plurality of signal lines and are arranged in a matrix shape.

Referring to the structure shown in FIG. 2, the liquid crystal panel assembly 300 includes a lower display panel 100 and an upper display panel 200 that face each other, and a liquid crystal layer 3 interposed therebetween.

The signal lines $G_1$-$G_n$, $D_1$-$D_m$, and SL are provided on the lower display panel 100, and include a plurality of gate lines $G_1$-$G_n$ that transmit gate signals (also referred to as "scanning signals"), and a plurality of data lines $D_1$-$D_m$ that transmit data signals. Also, referring to FIG. 2, the signal lines further include a common voltage line SL that is provided on the lower display panel 100 and applied with a predetermined voltage such as a common voltage Vcom.

Each pixel PX has a length in a row direction, for example a pixel PX that is connected to an i-th (i=1, 2, . . . , n) gate line $G_i$ and a j-th (j=1, 2, . . . , m) data line $D_j$, includes a switching element Q that is connected to the signal lines $G_i$ and $D_j$, and a liquid crystal capacitor Clc and a storage capacitor Cst that are connected to the switching element Q.

The switching element Q is a three terminal element such as a thin film transistor provided on the lower display panel 100, the control terminal of which is connected to a gate line $G_i$, the input terminal of which is connected to a data line $D_j$, and the output terminal of which is connected to the liquid crystal capacitor Clc and the storage capacitor Cst.

The liquid crystal capacitor Clc uses a pixel electrode 191 of the lower display panel 100 and a common electrode 270 of the upper display panel 200 as two terminals, while the liquid crystal layer 3 between the two electrodes 191 and 270 functions as a dielectric material. The pixel electrode 191 is connected to the switching element Q, while the common electrode 270 is formed on the whole surface of the upper display panel 200 and is applied with a common voltage Vcom.

The storage capacitor Cst functions as an auxiliary capacitor for the LC capacitor Clc. The storage capacitor Cst includes the pixel electrode 191 and the common voltage line SL which overlaps the pixel electrode 191 via an insulator. Alternatively, the storage capacitor Cst may include the pixel electrode 191 and a previous gate line $G_{i-1}$ which overlaps the pixel electrode 191 via an insulator.

For color display, each pixel PX uniquely represents one primary color (i.e., spatial division) or each pixel PX sequentially represents the primary colors in turn (i.e., temporal division), such that a spatial or temporal sum of the primary colors is recognized as a desired color. An example of a set of the primary colors includes red, green, and blue colors. FIG. 2 shows an example of the spatial division in which each pixel PX includes a color filter 230 representing one of the primary colors. The color filter 230 is located in an area of the upper display panel 200 facing the pixel electrode 191. Alternatively, the color filter 230 may be provided on or under the pixel electrode 191 on the lower display panel 100.

At least one polarizer (not shown) is attached on an outer side of the liquid crystal panel assembly 300.

Referring again to FIG. 1, the gray voltage generator 800 generates all gray voltages or a predetermined number of gray voltages (or reference gray voltages) controlling a transmittance of the pixels PX. The (reference) gray voltages may include one set having a positive value with respect to a common voltage Vcom, and another set having a negative value.

The gate driver 400 is connected to the gate lines $G_1$-$G_n$ of the liquid crystal panel assembly 300, and applies gate signals which comprise a gate-on voltage Von and a gate-off voltage Voff to the gate lines $G_1$-$G_n$. The gate driver 400 may be integrated on the liquid crystal panel assembly 300 along with the signal lines $G_1$-$G_n$, $D_1$-$D_m$, and SL, and the thin film transistor switching element Q. The gate driver 400 may be mounted directly on the liquid crystal panel assembly 300 in the form of at least one Integrated Circuit (IC) chip, may be mounted on a flexible printed circuit film (not shown) and then mounted on the liquid crystal panel assembly 300 in the form of a tape carrier package (TCP), or may be mounted on a separate printed circuit board (not shown).

The data driver 500 is connected to the data lines $D_1$-$D_m$ of the liquid crystal panel assembly 300, and selects the gray voltages from the gray voltage generator 800 to apply them to the data line $D_1$-$D_m$ as data voltages. When the gray voltage generator 800 does not supply all gray voltages for all grays but supplies only a predetermined number of reference gray voltages, the data driver 500 divides the reference gray voltages to generate the data voltages.

The signal controller 600 controls the gate driver 400 and the data driver 500.

Now, the operation of the above-described LCD will be explained in detail.

The signal controller 600 is supplied with input image signals R, G, and B and input control signals from an external graphics controller (not shown) for controlling the display. The input image signals R, G, and B contain luminance information of each pixel (PX). The luminance has a predetermined number of grays, such as 1024 ($=2^{10}$), 256 ($=2^8$), or 64 ($=2^6$). The input control signals include, for example, a vertical synchronization signal (Vsync), a horizontal synchronization signal (Hsync), a main clock signal (MCLK), and a data enable signal (DE).

The signal controller 600 processes the input image signals R, G, and B in accordance with the operating conditions of the liquid crystal panel assembly 300 based on the input control signals. The signal controller 600 generates a gate control signal CONT1, a data control signal CONT2, etc., and sends the gate control signal CONT1 to the gate driver 400 and the data control signal CONT2 and a processed image signal DAT to the data driver 500.

According to the data control signal CONT2 from the signal controller 600, the data driver 500 receives the digital image signal DAT for pixels PX of one row, selects the gray voltage corresponding to each digital image signal DAT to convert the digital image signal DAT into an analog image data signal, and applies the converted signal to the corresponding data lines $D_1$-$D_m$.

According to the gate control signal CONT1 from the signal controller 600, the gate driver 400 applies the gate-on voltage Von to the gate lines $G_1$-$G_n$ to turn on the switching elements Q connected to the gate lines $G_1$-$G_n$. The data signal applied to the data lines $D_1$-$D_m$ is then applied to corresponding pixels PX through the turned-on switching elements Q.

The difference between the voltage of the data signal applied to the pixel PX and the common voltage Vcom is represented as the charge voltage of the liquid crystal capacitor Clc, that is, the pixel voltage. The arrangement of the liquid crystal molecules is controlled according to the magnitude of the pixel voltage. Accordingly, the polarization of light that passes through the liquid crystal layer 3 is changed. The variation of the polarized light is expressed as a transmittance variance of the light by the polarizer attached to the display panel assembly 300, and therefore the pixel PX expresses the luminance represented by the grayscale of the image signals DAT.

The above operation is repeatedly performed having a horizontal period 1H corresponding to one period of the horizontal synchronization signal Hsync and the data enable signal DE, the gate-on voltage Von is sequentially applied to all the gate lines $G_1$-$G_n$, and the data voltage is applied to all the pixels so as to display an image of one frame.

Frames are sequentially displayed, and a state of the inversion signal RVS applied to the data driver 500 to invert the polarity of the data voltage applied to each pixel PX from the polarity of a previous frame is controlled, which is referred to as "frame inversion". In this case, in one frame, the polarity of the data voltage flowing through one data line may be periodically changed according to characteristics of the inversion signal RVS (e.g., row inversion and dot inversion), or the polarities of the data voltage applied to one pixel row may be different (e.g., column inversion and dot inversion).

The liquid crystal panel assembly 300 will be described in detail with reference to FIG. 3 and FIG. 4 as well as FIG. 1 and FIG. 2.

Figure 3:
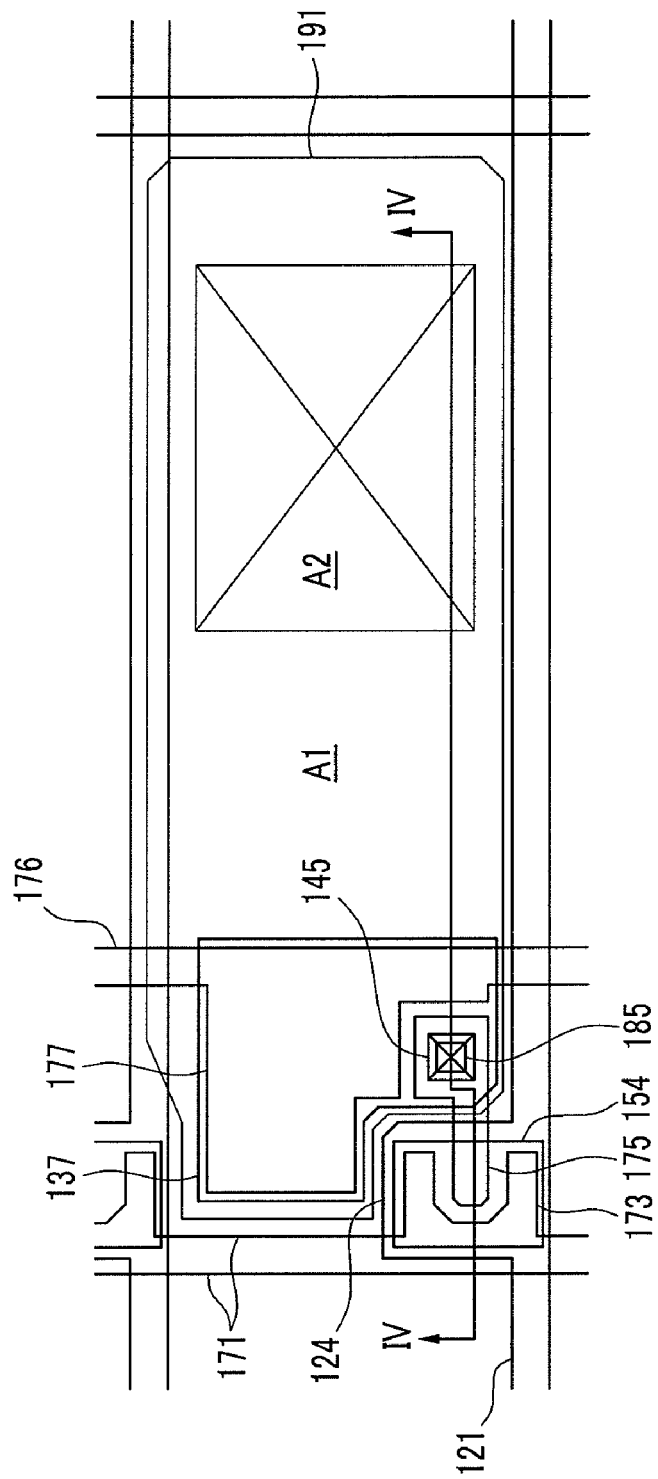
FIG. 3 is a layout view of one pixel in a liquid crystal panel assembly according to an exemplary embodiment of the present invention.
Figure 4:
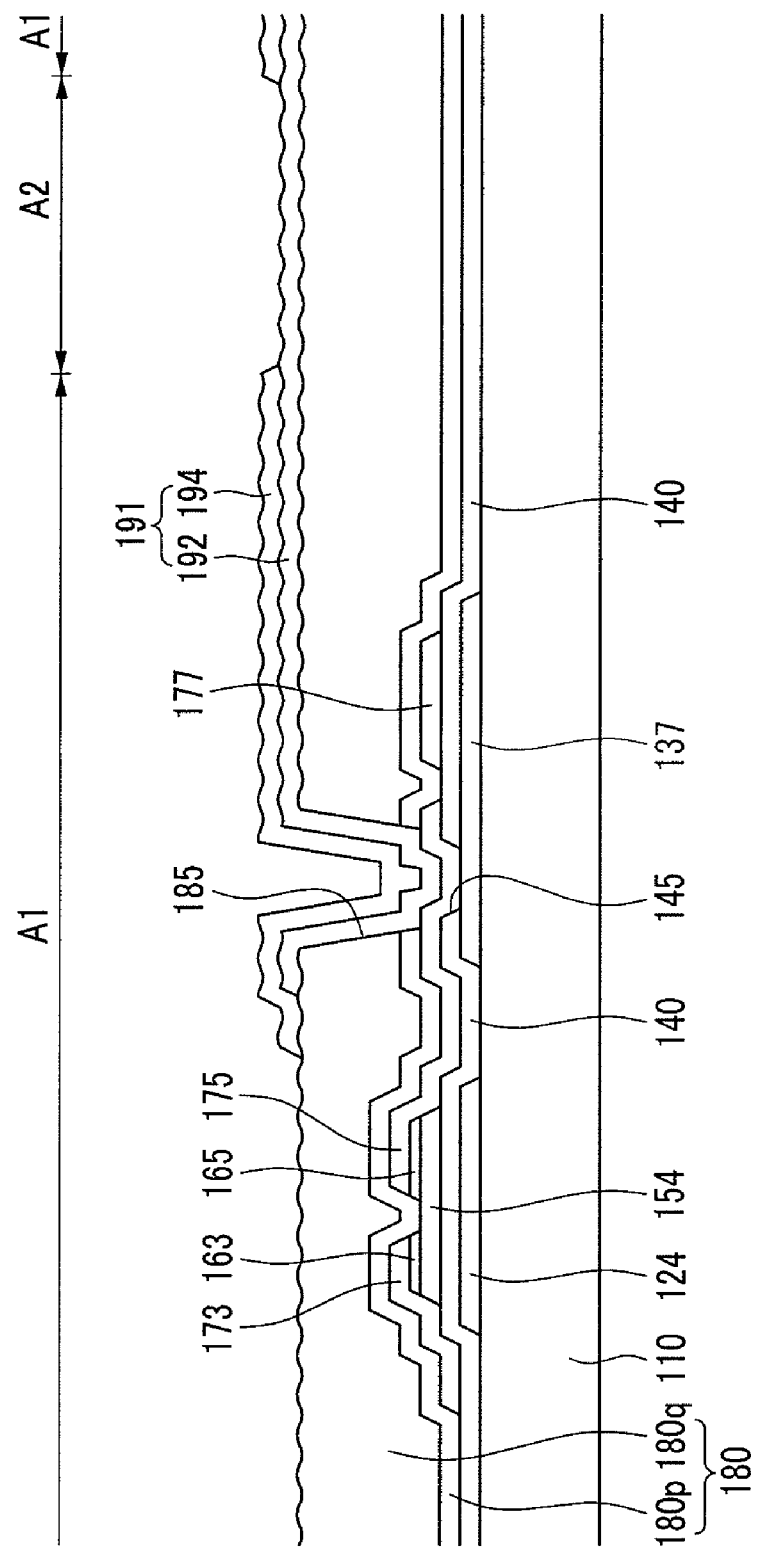
FIG. 4 is a cross-sectional view of the lower panel of the liquid crystal panel assembly shown in FIG. 3 taken along the line IV-IV.

FIG. 3 is a layout view of one pixel of a liquid crystal panel assembly 300 according to an exemplary embodiment of the present invention, and FIG. 4 is a cross-sectional view of the lower panel of the liquid crystal panel assembly 300 shown in FIG. 3 taken along the line IV-IV.

Referring to the lower display panel 100 of the liquid crystal panel assembly 300 according to an exemplary embodiment of the present invention, a plurality of gate lines 121 and a plurality of storage electrodes 137 are formed on an insulating substrate 110. The gate lines 121 transmit gate signals and extend in a transverse direction, and include a plurality of gate electrodes 124 protruding upward.

The storage electrodes 137 have an island shape and are approximately square with the left lower corner (based on the orientation of in FIG. 3) thereof cut, and maintain the same interval from two neighboring gate lines 121. The shape and the arrangement of the gate lines 121 including the gate electrodes 124 and storage electrode 137 may be changed.

A gate insulating layer 140 is formed on the gate lines 121 and the storage electrodes 137. The gate insulating layer 140 has a plurality of contact holes 145 exposing the storage electrodes 137.

A plurality of semiconductor islands 154 preferably made of hydrogenated amorphous silicon (simply referred to as a-Si) or polysilicon are formed on the gate insulating layer 140 above the gate electrodes 124.

A plurality of pairs of ohmic contact islands 163 and 165 are formed on the semiconductor islands 154. The ohmic contact islands 163 and 165 are preferably made of n+ hydrogenated a-Si heavily doped with an N-type impurity such as phosphorous, or may be made of a silicide.

A source electrode 173 and a drain electrode 175 are formed on the ohmic contacts 163 and 165. The source electrode 173, a drain electrode 175, and a common voltage line 176 are formed on the gate insulating layer 140.

The data lines 171 transmit data voltages and extend in a substantially longitudinal direction, thereby intersecting the gate lines 121. The data lines 171 include a plurality of source electrodes 173 extended toward the gate electrodes 124 and having a "C" shape.

The drain electrodes 175 are respectively separated from the data lines 171, and face the source electrodes 173 with respect to the gate electrodes 124. Each of the drain electrodes 175 includes one end portion having a wide area, and the other end portion having a bar shape and having a portion enclosed by the "C" shape of the source electrodes 173. The drain electrodes 175 are physically and electrically connected to the storage electrodes 137 through the contact holes 145, and transmit data voltages from the data lines 171 to the storage electrodes 137.

The common voltage lines 176 receive a predetermined voltage such as the common voltage Vcom, and are substantially parallel to the data lines 171. Each common voltage line 176 is closer to the data line 171 of a left side among the two adjacent data lines 171 (based on the orientation of in FIG. 3), and includes an expansion 177 having a wide area. The expansion 177 overlaps the storage electrode 137 disposed thereunder via the gate insulating layer 140. The shape and arrangement of the common voltage lines 176 including the expansions 177 may be changed in various forms.

A gate electrode 124, a source electrode 173, and a drain electrode 175 form a thin film transistor (TFT) Q along with the semiconductor island 154. A channel of the thin film transistor Q is formed on the semiconductor island 154 between the source electrode 173 and the drain electrode 175.

The ohmic contacts 163 and 165 are interposed only between the underlying semiconductor islands 154 and the overlying data lines 171 and the drain electrodes 175 thereon, and reduce contact resistance therebetween. The semiconductor islands 154 include exposed portions that are not covered by the source electrodes 173 and the drain electrodes 175 disposed between the source electrodes 173 and the drain electrodes 175.

A passivation layer 180 is formed on the data lines 171, the drain electrodes 175, the common voltage lines 176, and the exposed portions of the semiconductor islands 154. The passivation layer 180 includes a lower passivation layer 180$p$ and an upper passivation layer 180$q$.

The lower passivation layer 180$p$ may be made of an inorganic insulator such as silicon nitride or silicon oxide, and enhances the adhesion between the data lines 171 and drain electrodes 175, and the upper passivation layer 180$q$.

The upper passivation layer 180$q$ may be made of an organic material having photosensitivity, and the surface thereof is embossed to be uneven.

The passivation layer 180 has a plurality of contact holes 185 exposing a portion of the drain electrodes 175 disposed on the contact holes 145.

Accordingly, contact holes 145 and 185 overlap each other, thereby increasing the aperture ratio of the liquid crystal display.

A plurality of pixel electrodes 191 are formed on the passivation layer 180. Each pixel electrode 191 is embossed according to the protrusions and depressions of the upper passivation layer 180$q$, and includes a transparent electrode 192 and a reflective electrode 194 thereon.

The transparent electrode 192 is made of a transparent conductive material such as ITO or IZO, and the reflective electrode 194 is made of a reflective conductive material such as aluminum (Al), silver (Ag), chromium (Cr), or alloys thereof.

A portion of the transparent electrode 192 is exposed by the reflective electrode 194. The reflective electrode 194 is formed according to the surface of the transparent electrode 192 such that it includes convex portions and concave portions like the transparent electrode 192.

The transflective LCD that includes the lower display panel 100, the upper display panel 200, and the liquid crystal layer 3 may be divided into a transmissive region and a reflective region that are defined by the transparent electrode 192 and the reflective electrode 194. The portions disposed where the reflective electrode 194 is positioned are the reflective region A1, and the portions where the reflective electrode 194 is removed and the transparent electrode 192 is exposed are the transmissive area A2.

In the reflective region A1, incident light from the front passes through the liquid crystal layer 3, and then is reflected by the reflective electrode 194, and passes through the liquid crystal layer 3 again, and is emitted to the front, thereby displaying an image. The embossing of the reflective electrode 194 increases light reflection efficiency. In the transmissive region A2, incident light from the rear of the liquid crystal display, from the direction of the lower substrate 100, passes through the liquid crystal layer 3 and is emitted toward the front of the liquid crystal display in the direction of the upper display panel 200, thereby displaying an image.

The pixel electrodes 191 are physically and electrically connected to the drain electrodes 175 through the contact holes 185, and receive the data voltages from the drain electrodes 175 along with the storage electrodes 137. The pixel electrodes 191, to which data voltage are applied, generate an electric field together with the common electrode 270 of the upper display panel 200 that receives the common voltage, to thereby determine an arrangement of liquid crystal molecules (not shown) of the liquid crystal layer 3 between the two electrodes 191 and 270. Polarization of light that passes through the liquid crystal layer 3 differs depending on the arrangement of the liquid crystal molecules. The pixel electrode 191 and the common electrode 270 form the liquid crystal capacitor to sustain the applied voltage even after the TFT is turned off.

The pixel electrodes 191 and the storage electrodes 137 connected thereto overlap the expansions 177 of the common voltage lines 176 to form storage capacitors Cst, and the storage capacitors Cst increase the voltage storage capability of the liquid crystal capacitor Clc.

In this way, the common voltage line 176 receiving the common voltage Vcom to form the storage capacitor Cst is formed in the same layer as the data line 171, and is disposed substantially parallel to the data line 171 such that the storage capacitor Cst may overlap the one corner of the pixel electrode 191 and be disposed thereon. Accordingly, in a transflective LCD according to an exemplary embodiment of the present invention, a transmissive region A2 is formed where the reflective electrode 194 is removed.

Also, the expansion 177 of the common voltage line 176 simultaneously overlaps the underlying storage electrode 137 and the overlying pixel electrode 191 such that the area of the storage capacitor Cst may be reduced and the storage capacitance Cst may be sufficiently obtained.

A manufacturing method of a liquid crystal display according to an exemplary embodiment of the present invention will be described with reference to FIG. 5 to FIG. 9.

FIG. 5 to FIG. 9 are layout views sequentially showing the manufacturing process for manufacturing the lower display panel 100 of the liquid crystal panel assembly 300 shown in FIG. 3 and FIG. 4 according to an exemplary embodiment of the present invention.

Figure 5:
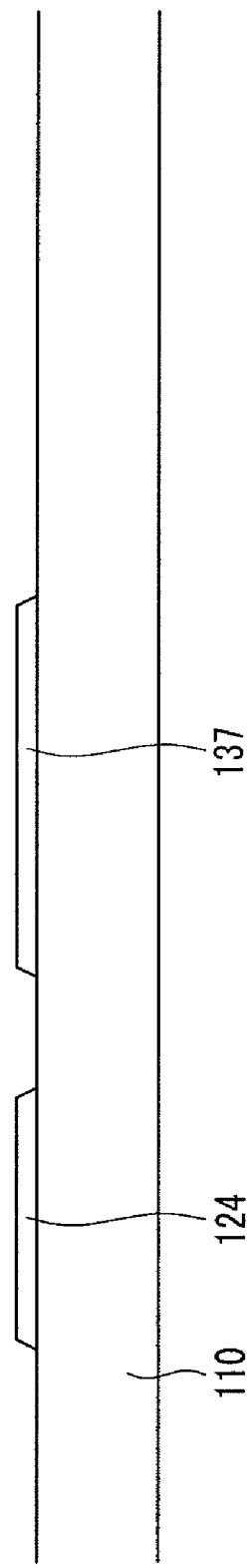
FIG. 5 to FIG. 9 are layout views sequentially showing the manufacturing process for manufacturing the lower panel of the liquid crystal panel assembly shown in FIG. 3 and FIG. 4 according to an exemplary embodiment of the present invention.

As shown in FIG. 5, a metal layer is deposited on an insulating substrate 110 and patterned by photolithography to form a plurality of gate lines 121 including a plurality of gate electrodes 124 and a plurality of storage electrode islands 137.

Figure 6:
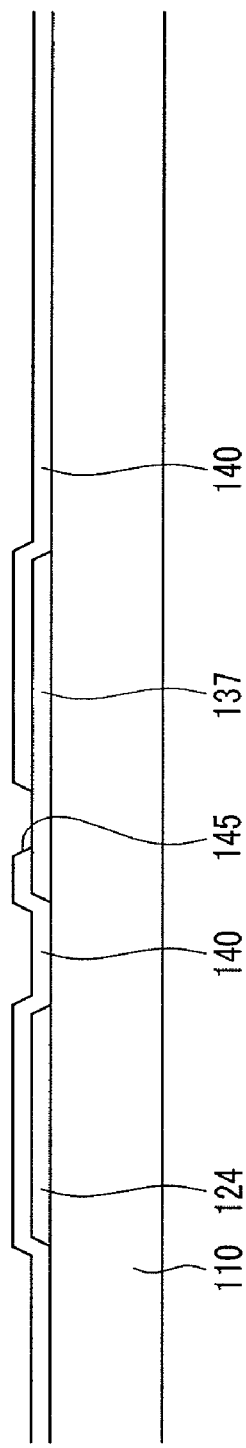

As shown in FIG. 6, a gate insulating layer 140 having a plurality of contact holes 145 is formed on the gate line 121, the storage electrode 137, and the insulating substrate 110.

Figure 7:
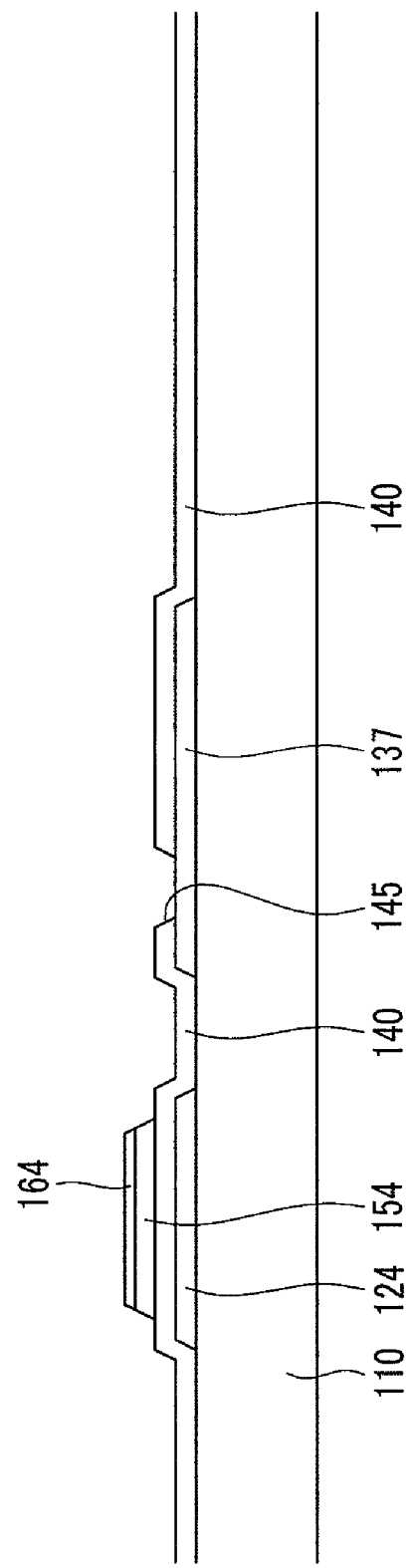

As shown in FIG. 7, an intrinsic amorphous silicon layer and an impurity-doped amorphous silicon layer are sequentially deposited on the gate insulating layer 140 and the exposed storage electrodes 137 and patterned by photolithography to form a plurality of semiconductor islands 154 and a plurality of ohmic contact layers 164.

Figure 8:
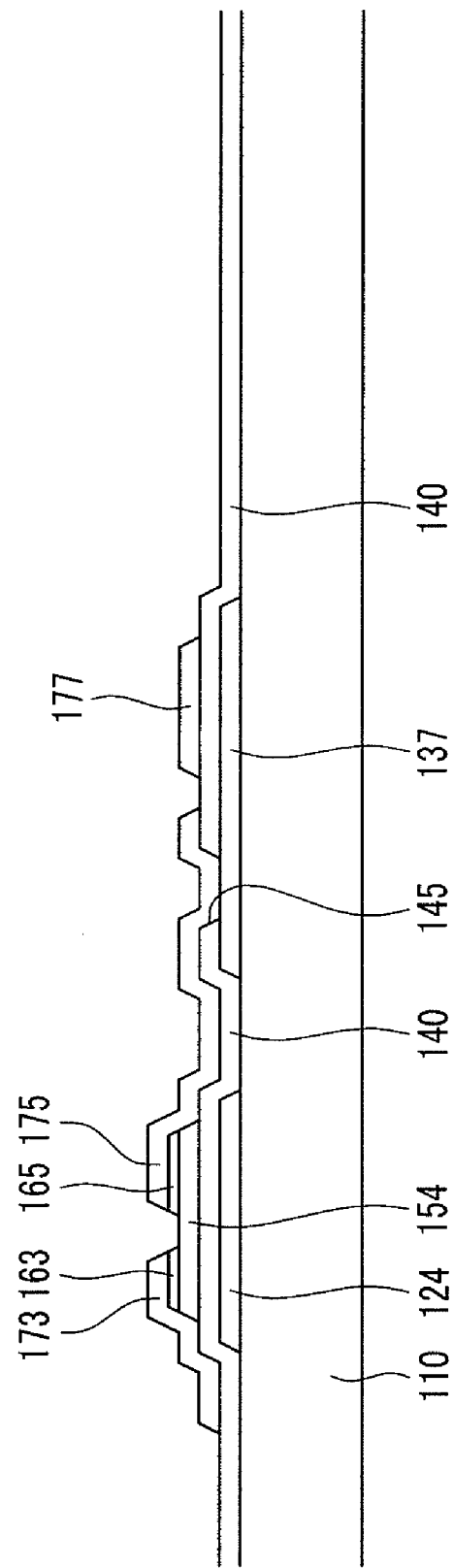

As shown in FIG. 8, a metal layer is deposited on the gate insulating layer 140 and the ohmic contact layers 164, and patterned by photolithography to form a plurality of data lines 171 including a plurality of source electrodes 173, a plurality of drain electrodes 175, and a common voltage line 176 including a plurality of expansions 177.

The exposed ohmic contact layers 164 are etched by using the data lines 171 and the drain electrodes 175 as an etch mask to form a plurality of pairs of ohmic contacts 163 and 165, and expose portions of the semiconductors 154.

Figure 9:
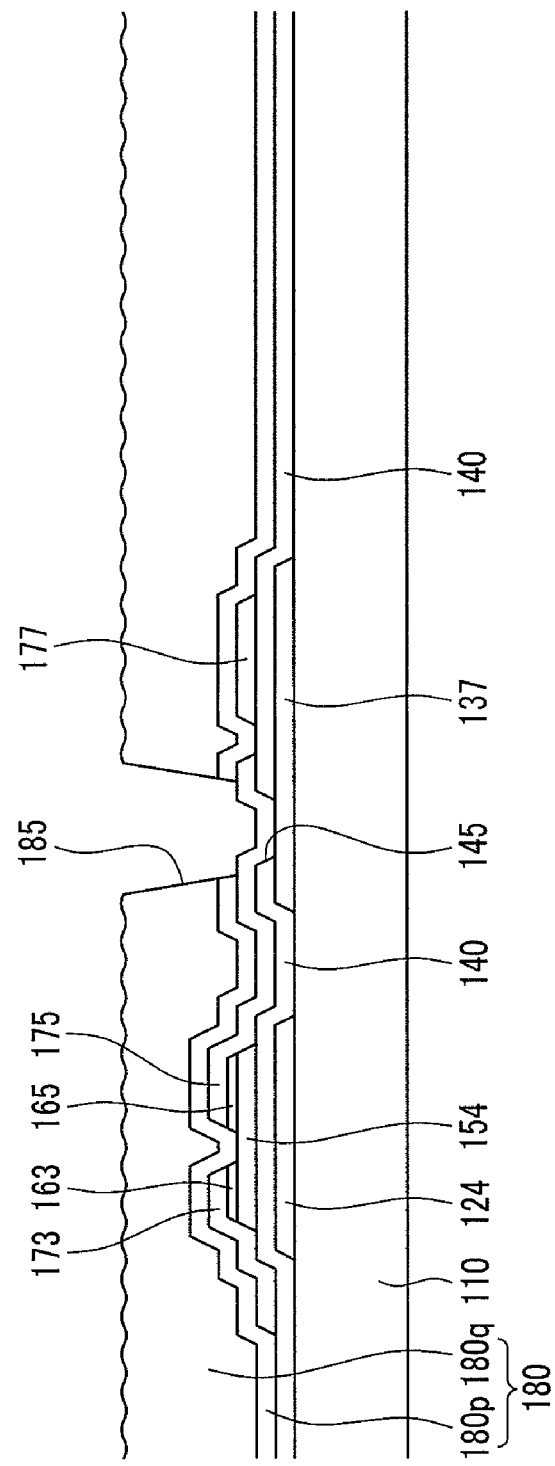

As shown in FIG. 9, a lower passivation layer 180p is formed on the data lines 171, the drain electrodes 175, the common voltage line 176, and the exposed semiconductor island 154 by depositing silicon nitride or silicon oxide, for example, through a plasma enhanced chemical vapor deposition (PECVD) method using plasma.

A photosensitive organic material is coated on the lower passivation layer 180p and exposed to light using a mask including a slit pattern and developed to form an upper passivation layer 180q having an uneven surface and having a plurality of contact holes 185 disposed on the contact holes 145 of the gate insulating layer 140.

The lower passivation layer 180p is etched using the upper passivation layer 180q as an etch mask to expose portions of the drain electrodes 175 through the contact holes 185.

As shown in FIG. 4, ITO or IZO is deposited on the upper passivation layer 180q and patterned to form a plurality of transparent electrodes 192, and an opaque metal is deposited and etched to form a plurality of reflective electrodes 194. The transparent electrode 192 and the reflective electrode 194 are formed to be uneven according to the surface of the upper passivation layer 180q.

Another exemplary embodiment of a liquid crystal panel assembly 300 of FIG. 1 and FIG. 2 will be described with reference to FIG. 10 and FIG. 11.

Figure 10:
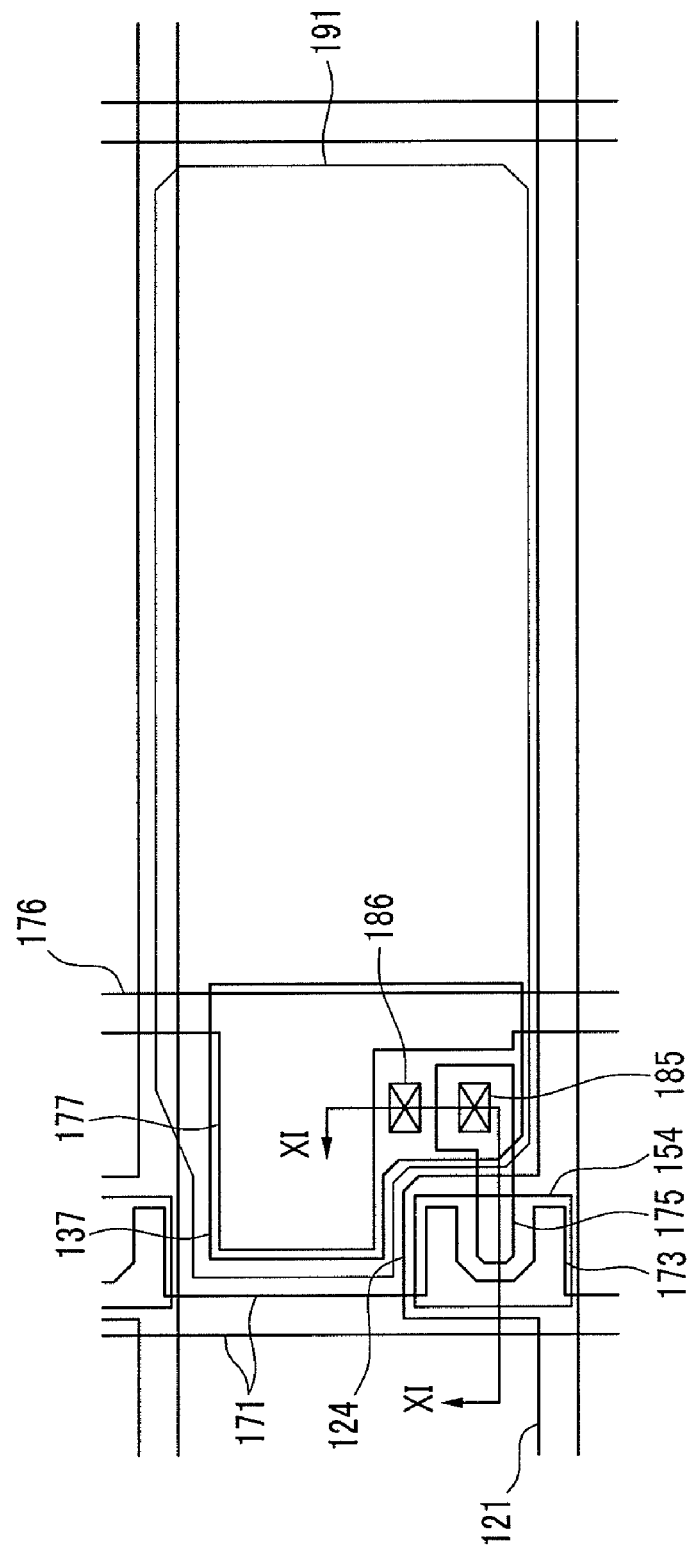
FIG. 10 is a layout view of one pixel in a liquid crystal panel assembly according to another exemplary embodiment of the present invention.
Figure 11:
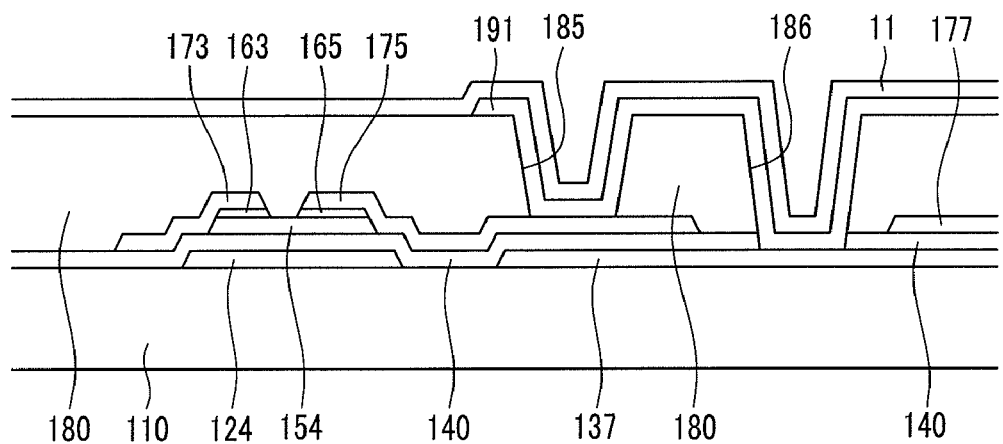
FIG. 11 is a cross-sectional view of the lower panel of the liquid crystal panel assembly shown in FIG. 10 taken along the line XI-XI.

FIG. 10 is a layout view of one pixel in a liquid crystal panel assembly 300 according to another exemplary embodiment of the present invention, and FIG. 11 is a cross-sectional view of the lower display panel of the liquid crystal panel assembly 300 shown in FIG. 10 taken along the line XI-XI.

The layered structure of the liquid crystal panel assembly of FIG. 10 and FIG. 11 is substantially the same as the layered structure of the lower display panel 100 of the liquid crystal panel assembly shown in FIG. 3 and FIG. 4. Hereafter, different characteristics from the FIG. 3 and FIG. 4 will be described.

A plurality of gate lines 121 including a plurality of gate electrodes 124 and a plurality of storage electrodes 137 are formed on an insulating substrate 110, and a gate insulating layer 140 is formed thereon. A plurality of semiconductor islands 154 and a plurality of pairs of ohmic contact islands 163 and 165 are sequentially formed on the gate insulating layer 140, and a plurality of data lines 171 including a plurality of source electrodes 173, a plurality of drain electrodes 175, and a plurality of common voltage lines 176 including a plurality of expansions 177 are formed thereon. A passivation layer 180 is formed on the data lines 171, the drain electrodes 175, the common voltage lines 176, and the exposed semiconductor islands 154.

The passivation layer 180 has a plurality of contact holes 185 exposing a portion of the drain electrodes 175, and the passivation layer 180 and the gate insulating layer 140 have a plurality of contact holes 186 exposing a portion of the storage electrodes 137.

A plurality of pixel electrodes 191 and an alignment layer 11 are sequentially formed on the passivation layer 180.

The pixel electrodes 191 receive the data voltages through the contact holes 185 from the drain electrodes 175. The storage electrodes 137 receive data voltages through the contact holes 186 from the pixel electrodes 191. The pixel electrodes 191 and the storage electrodes 137 connected thereto overlap the expansions 177 of the common voltage lines 176 to form the storage capacitors Cst such that the area of the storage capacitor Cst may be reduced, thereby increasing the aperture ratio.

An exemplary manufacturing method of the lower display panel 100 of the liquid crystal panel assembly shown in FIG. 10 and FIG. 11 will be described with reference to FIG. 12 to FIG. 15.

FIG. 12 to FIG. 15 are layout views sequentially showing the manufacturing process for manufacturing the lower display panel 100 of the liquid crystal panel assembly 300 shown in FIG. 10 and FIG. 11 according to an exemplary embodiment of the present invention.

Figure 12:
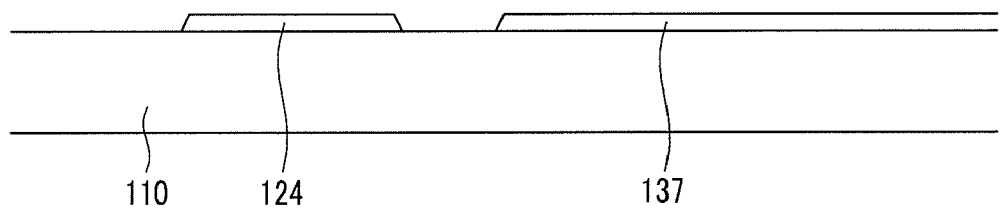
FIG. 12 to FIG. 15 are layout views sequentially showing the manufacturing process for manufacturing the lower panel of the liquid crystal panel assembly shown in FIG. 10 and FIG. 11 according to an exemplary embodiment of the present invention.

As shown in FIG. 12, a metal layer is deposited on an insulating substrate 110 and patterned by photolithography to form a plurality of gate lines 121 including a plurality of gate electrodes 124 and a plurality of storage electrode islands 137.

Figure 13:
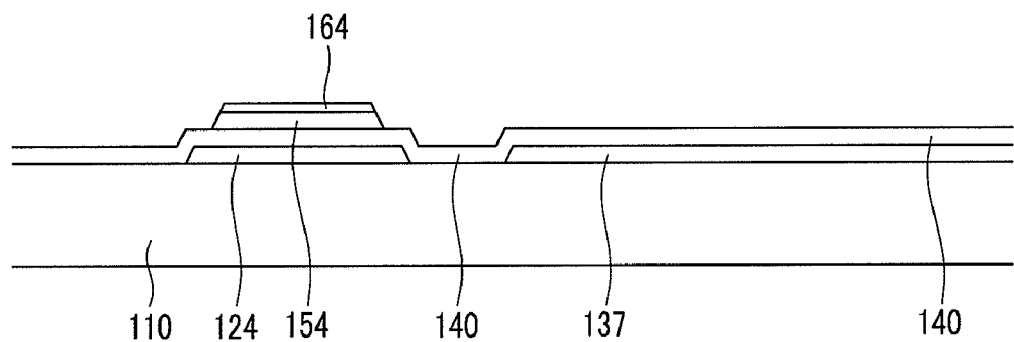

As shown in FIG. 13, a gate insulating layer 140 is formed on the gate lines 121, the storage electrodes 137, and the insulating substrate 110, and an intrinsic amorphous silicon layer and an impurity-doped amorphous silicon layer are deposited thereon and patterned by photolithography to form a plurality of semiconductor islands 154 and a plurality of ohmic contact layers 164.

Figure 14:
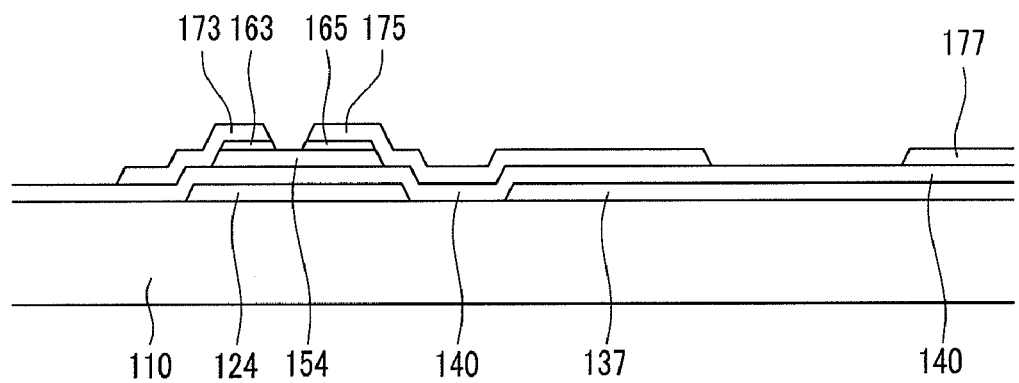

As shown in FIG. 14, a metal layer is deposited on the gate insulating layer 140 and the ohmic contact layers 164, and is patterned by photolithography to form a plurality of data lines 171 including a plurality of source electrodes 173, a plurality of drain electrodes 175, and a common voltage line 176 including a plurality of expansions 177.

The exposed ohmic contact layers 164 are etched by using the data lines 171 and the drain electrodes 175 as an etch mask to form a plurality of pairs of ohmic contacts 163 and 165 and to expose portions of the semiconductors 154.

Figure 15:
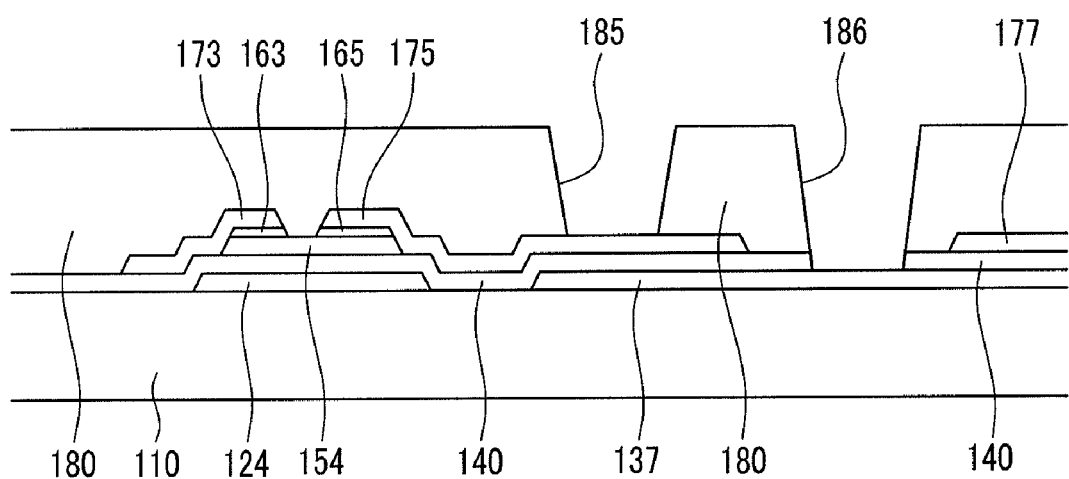

As shown in FIG. 15, a passivation layer 180 is deposited on the data lines 171, the drain electrodes 175, the common voltage lines 176, and the exposed semiconductor islands 154, and patterned along with the gate insulating layer 140 to form a plurality of contact holes 185 and a plurality of contact holes 186.

As shown in FIG. 11, a plurality of pixel electrodes 191 are formed on the passivation layer 180, and an alignment layer 11 is coated thereon.

Characteristics of the liquid crystal panel assembly 300 shown in FIG. 3 and FIG. 4 may apply to the liquid crystal panel assembly 300 shown in FIG. 10 and FIG. 11.

Another exemplary embodiment of the liquid crystal panel assembly 300 shown in FIG. 1 and FIG. 2 will be described with reference to FIG. 16 and FIG. 17.

Figure 16:
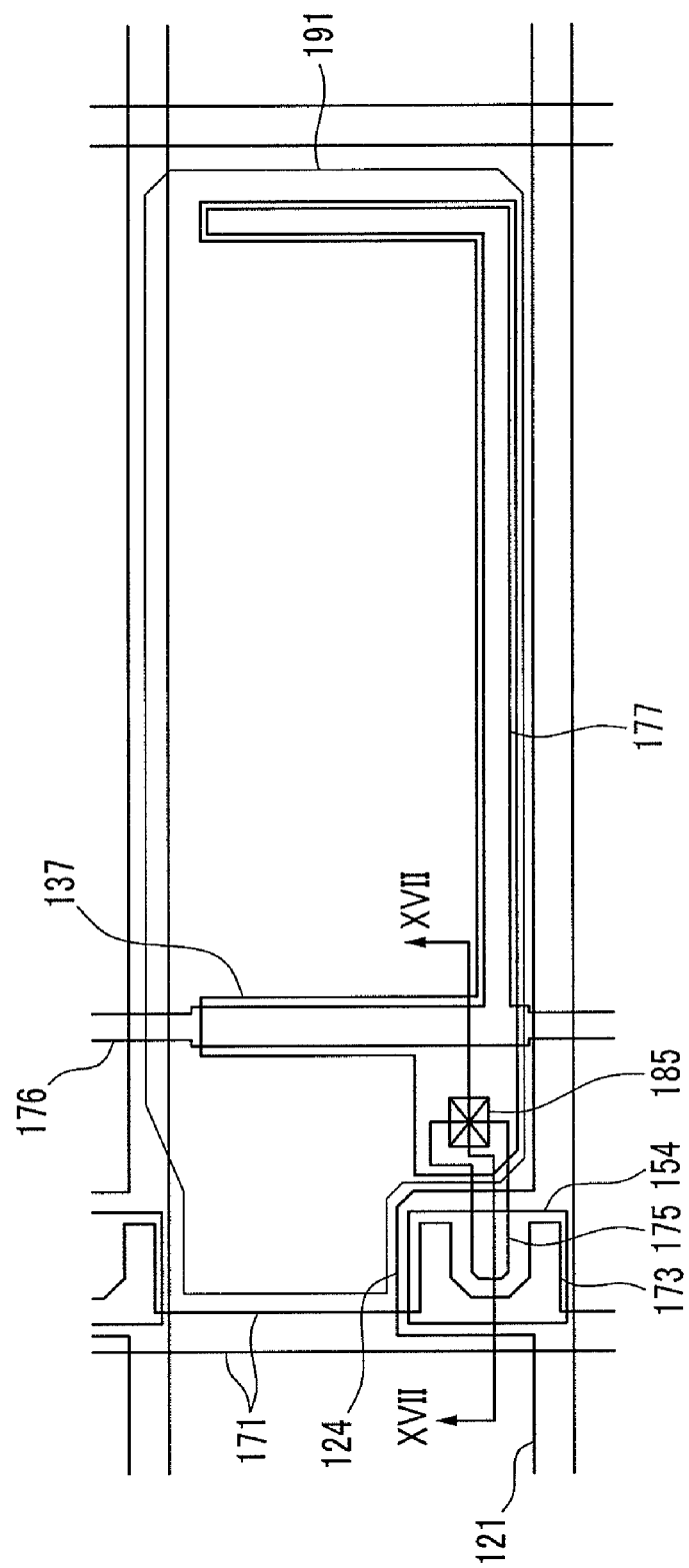
FIG. 16 is a layout view of one pixel in a liquid crystal panel assembly according to another exemplary embodiment of the present invention.
Figure 17:
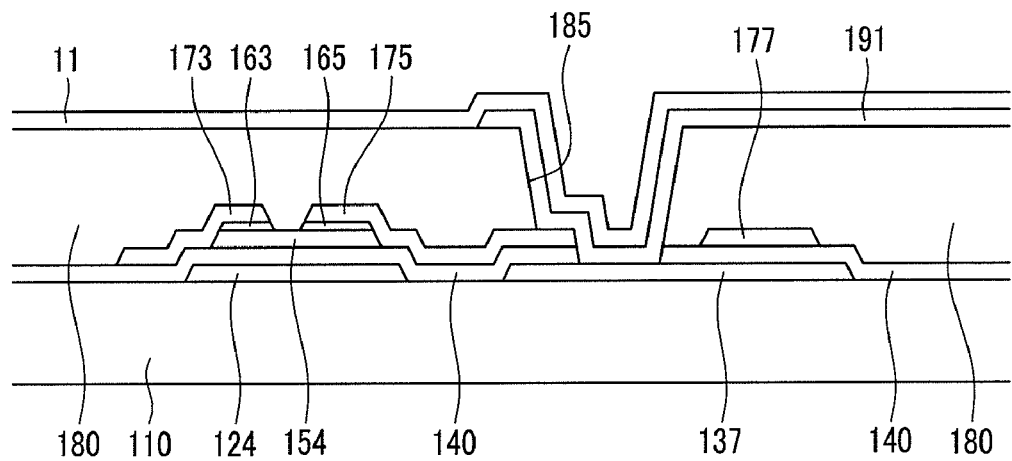
FIG. 17 is a cross-sectional view of the lower panel of the liquid crystal panel assembly shown in FIG. 16 taken along the line XVII-XVII.

FIG. 16 is a layout view of one pixel in a liquid crystal panel assembly 300 according to another exemplary embodiment of the present invention, and FIG. 17 is a cross-sectional view of the lower panel of the liquid crystal panel assembly shown in FIG. 16 taken along the line XVII-XVII.

The layered structure of the liquid crystal panel assembly 300 according to FIG. 16 and FIG. 17 is substantially the same as the layered structure of the lower panel of the liquid crystal panel assembly 300 shown in FIG. 10 and FIG. 11. Hereafter, different characteristics from FIG. 10 and FIG. 11 will be described.

A plurality of gate lines 121 and a plurality of storage electrode islands 137 are formed on an insulating substrate 110.

The storage electrodes 137 include a transverse portion substantially parallel to the lower gate line 121, a pair of longitudinal portions respectively extending upward from both ends of the transverse portion away from the lower gate line 121, and a protrusion extending towards a TFT.

A gate insulating layer 140 is formed on the substrate 110, the gate line 121, and the storage electrodes 137, and a plurality of semiconductor islands 154 and a plurality of pairs of ohmic contact islands 163 and 165 are sequentially formed thereon. A plurality of data lines 171 including a plurality of source electrodes 173, a plurality of drain electrodes 175, and a plurality of common voltage lines 176 including a plurality of expansions 177 are formed thereon.

More than about half of each expansion 177 overlaps the underlying storage electrodes 137, and includes a transverse portion and a pair of longitudinal portions at both ends of the transverse portion.

A passivation layer 180 is formed on the data lines 171, the drain electrodes 175, the common voltage lines 176, and the exposed semiconductor islands 154.

The passivation layer 180 has a plurality of contact holes 185 simultaneously exposing portions of the drain electrodes 175 and portions of the protrusions of the storage electrode 137.

A plurality of pixel electrodes 191 and an alignment layer 11 are sequentially formed on the passivation layer 180.

The drain electrodes 175 simultaneously apply data voltages to the pixel electrodes 191 and the storage electrodes 137 through the contact holes 185. The pixel electrode 191 and the storage electrode 137 receiving the data voltages overlap the expansions 177 of the common voltage lines 176 to form a storage capacitor Cst.

According to an exemplary embodiment of the present invention, when the common voltage lines 176 are disposed in the same layer as the data lines 171 and parallel to the data lines 171, as show in FIG. 10 and FIG. 11, the storage electrodes 137 and the expansions 177 forming the storage capacitor Cst are not locally formed, but they may become long according to the edges of the pixel electrodes 191. The overlapping between the storage electrodes 137 and the expansions 177 may be disposed between pixel electrodes 191 such that they may block light leakage.

An exemplary manufacturing method of the lower panel of the liquid crystal panel assembly shown in FIG. 16 and FIG. 17 will be described with reference to FIG. 18 to FIG. 21.

FIG. 18 to FIG. 21 are layout views sequentially showing an exemplary manufacturing process for manufacturing the lower display panel 100 of the liquid crystal panel assembly 300 shown in FIG. 16 and FIG. 17 according to an exemplary embodiment of the present invention.

Figure 18:
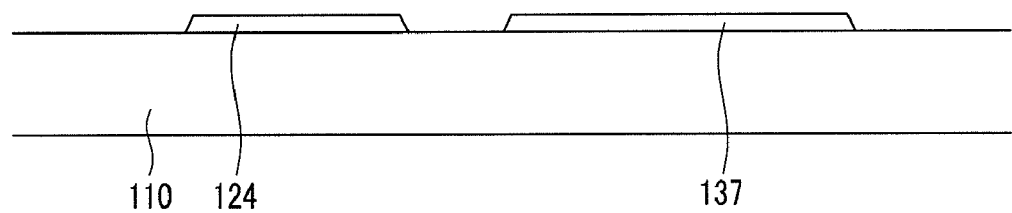
FIG. 18 to FIG. 21 are layout views sequentially showing the manufacturing process for manufacturing the lower panel of the liquid crystal panel assembly shown in FIG. 16 and FIG. 17 according to an exemplary embodiment of the present invention.

As shown in FIG. 18, a plurality of gate lines 121 including a plurality of gate electrodes 124 and a plurality of storage electrode islands 137 are formed on an insulating substrate 110.

Figure 19:
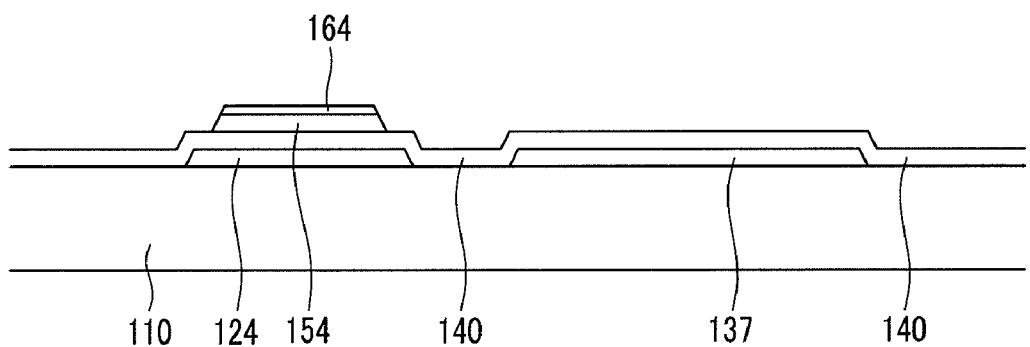

As shown in FIG. 19, a gate insulating layer 140 is formed on the gate lines 121, the storage electrodes 137, and the insulating substrate 110, and an intrinsic amorphous silicon layer and an impurity-doped amorphous silicon layer are deposited thereon and patterned by photolithography to form a plurality of semiconductor islands 154 and a plurality of ohmic contact layers 164.

Figure 20:
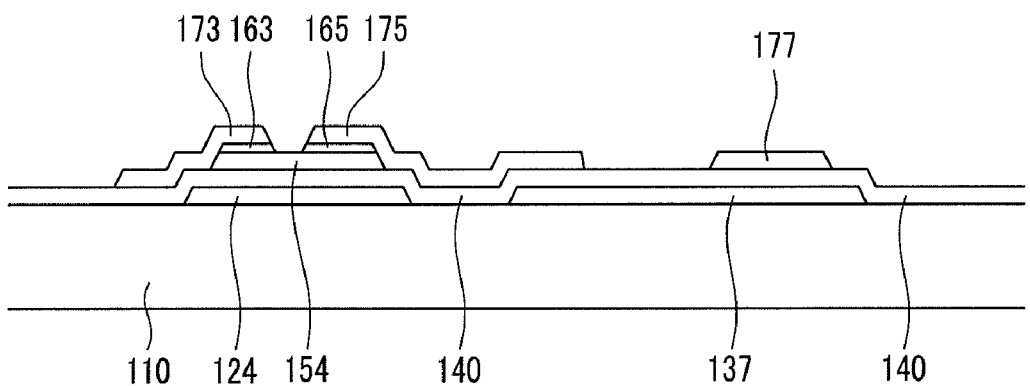

As shown in FIG. 20, a metal layer is deposited on the gate insulating layer 140 and the ohmic contact layers 164 and patterned by photolithography to form a plurality of data lines 171 including a plurality of source electrodes 173, a plurality of drain electrodes 175, and a common voltage line 176 including a plurality of expansions 177.

The exposed ohmic contact layers 164 are etched by using the data lines 171 and the drain electrodes 175 as an etch mask to form a plurality of pairs of ohmic contacts 163 and 165, and to expose portions of the semiconductors 154.

Figure 21:
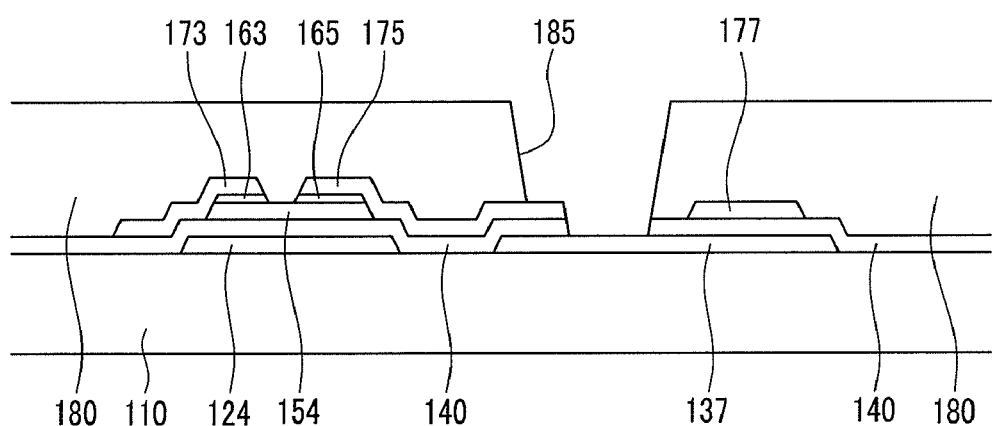

As shown in FIG. 21, a passivation layer 180 is deposited on the data lines 171, the drain electrodes 175, the common voltage lines 176, and the exposed semiconductor islands 154 and patterned along with the gate insulating layer 140 to form a plurality of contact holes 185 simultaneously exposing the drain electrodes 175 and the storage electrodes 137. The gate insulating layer 140 under the drain electrodes 175 is not etched since the drain electrode 175 functions as a mask.

As shown in FIG. 16, a plurality of pixel electrodes 191 are formed on the passivation layer 180 and an alignment layer 11 is coated thereon.

The contact holes 185 for simultaneously transmitting data voltages from the drain electrode 175 to the pixel electrodes 191 and the storage electrodes 137 may be formed at one position through one process.

Characteristics of the liquid crystal panel assembly shown in FIG. 10 to FIG. 15 may apply to the liquid crystal panel assembly shown in FIG. 16 to FIG. 21.

Another exemplary embodiment of the liquid crystal panel assembly 300 shown in FIG. 1 and FIG. 2 will be described with reference to FIG. 22 and FIG. 23.

Figure 22:
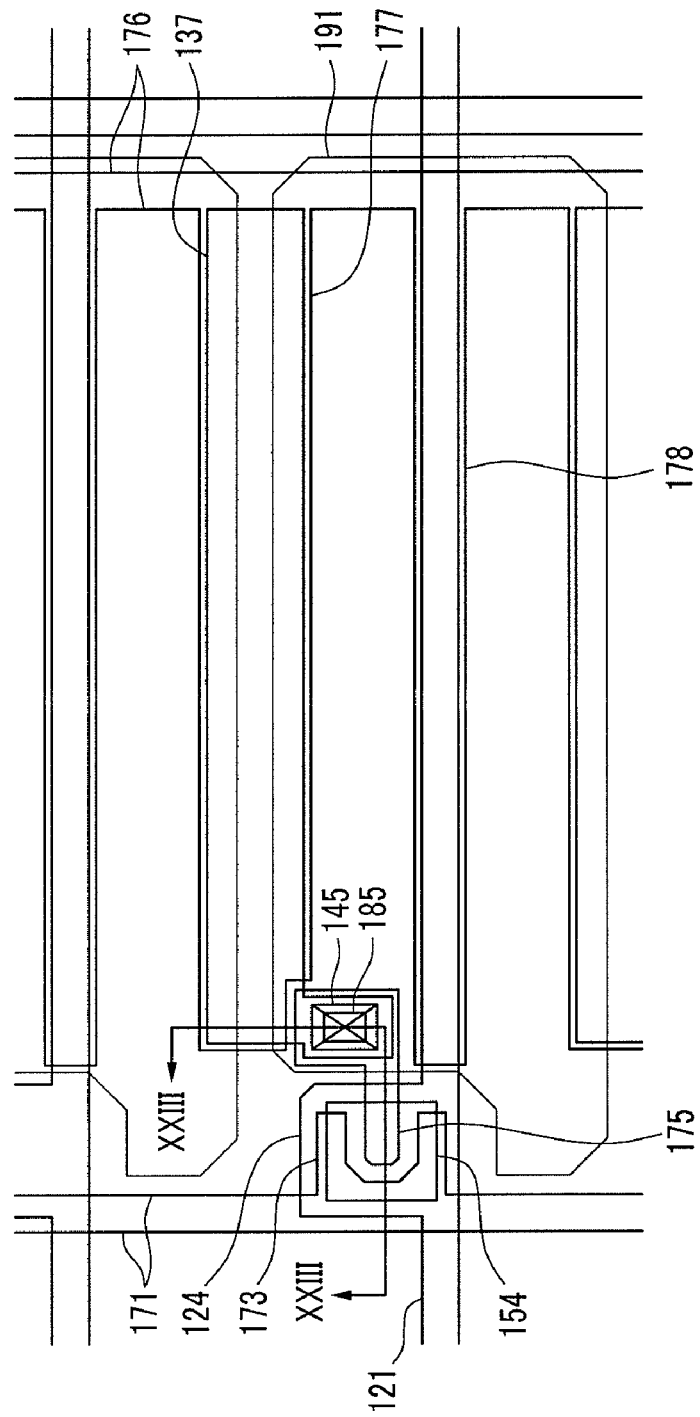
FIG. 22 is a layout view of one pixel in a liquid crystal panel assembly according to another exemplary embodiment of the present invention.
Figure 23:
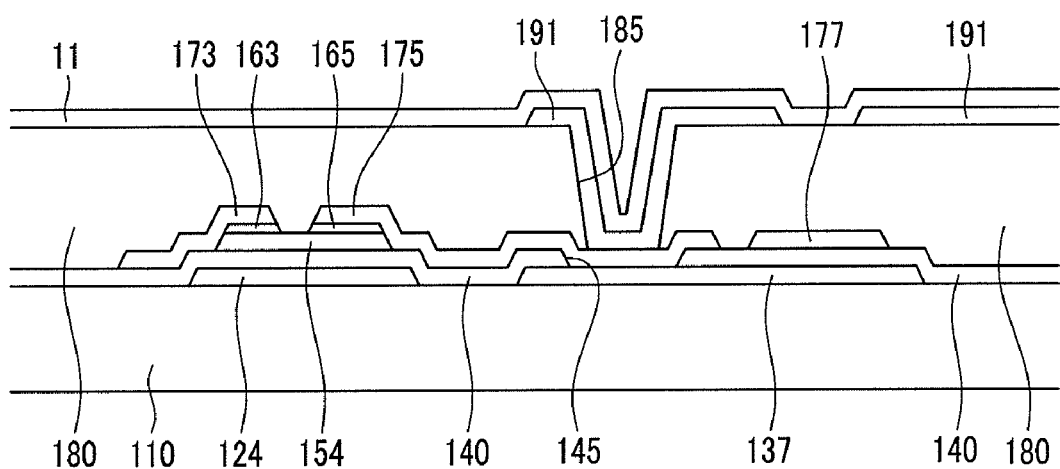
FIG. 23 is a cross-sectional view of the lower panel of the liquid crystal panel assembly shown in FIG. 22 taken along the line XXIII-XXIII.

FIG. 22 is a layout view of one pixel in a liquid crystal panel assembly 300 according to another exemplary embodiment of the present invention, and FIG. 23 is a cross-sectional view of the lower display panel 100 of the liquid crystal panel assembly shown in FIG. 22 taken along the line XXIII-XXIII.

The layered structure of the liquid crystal panel assembly according to FIG. 22 and FIG. 23 is substantially the same as the layered structure of the lower display panel 100 of the liquid crystal panel assembly 300 shown in FIG. 3 and FIG. 4.

A plurality of gate lines 121 and a plurality of storage electrode islands 137 are formed on an insulating substrate 110.

The storage electrodes 137 are disposed between two neighboring gate lines 121, and maintain the same interval from the two neighboring gate lines 121. Each of the storage electrodes 137 has a substantially rectangular shape which is long in a transverse direction, and includes a protrusion disposed in the corner of the left and lower side for contact with another layer (based on the orientation of in FIG. 22).

A gate insulating layer 140 having a plurality of contact holes 145a exposing the protrusions of the storage electrodes 137 is formed on the substrate 110, the gate lines 121, and the storage electrodes 137, and a plurality of semiconductor islands 154 and a plurality of pairs of ohmic contact islands 163 and 165 are sequentially formed thereon.

A plurality of data lines 171 including a plurality of source electrodes 173, a plurality of drain electrodes 175, and a plurality of common voltage lines 176 are formed on the gate insulating layer 140 and the ohmic contacts 163 and 165.

The common voltage lines 176 include a plurality of expansion electrodes 177 and a plurality of cover electrodes 178, which extend to the left side. The width of the expansion electrodes 177 is wider than the width of the cover electrodes 178, and the expansion electrodes 177 overlap the storage electrodes 137. The cover electrodes 178 extend toward the gate electrodes 124 and cover the gate lines 121.

A passivation layer 180 is formed on the data lines 171, the drain electrodes 175, the common voltage lines 176, and the exposed semiconductor islands 154, and the passivation layer 180 has a plurality of contact holes 185 exposing a portion of the drain electrodes 175 and disposed on the contact holes 145 of the gate insulating layer 140.

A plurality of pixel electrodes 191 and an alignment layer 11 are sequentially formed on the passivation layer 180.

According to an exemplary embodiment of the present invention, the pixel electrodes 191 receive data voltages from the drain electrodes 175 through the contact holes 185, and the storage electrode 137 receive the data voltages from the drain electrodes 175 through the contact holes 145 along with the pixel electrodes 191.

According to an exemplary embodiment of the present invention, the contact holes 185 for connection of the drain electrodes 175 and the pixel electrodes 191 are disposed on the contact holes 145 for connection of the drain electrodes 175 and the storage electrodes 137, thereby increasing the aperture ratio.

Also, the gate lines 121 transverse the pixel electrodes 191 in the transverse direction and overlap the pixel electrodes such that a difference of the kick-back voltage according to the change of the application direction of the gate signals is substantially prevented.

Furthermore, the gate lines 121 are covered by the portions of the common voltage lines 176 such that a change of the voltages of the pixel electrodes may be substantially prevented when applying the gate-off voltage Voff to the gate lines 121, thereby substantially eliminating the kick-back voltage.

Also, according to an exemplary embodiment of the present invention, the overlapping portion of the storage electrodes 137 and the expansion electrodes 177 are disposed between the neighboring pixel electrodes 191 such that they function as a light blocking member for preventing light leakage.

Various characteristics of the liquid crystal panel assembly shown in FIG. 3 to FIG. 21 are applicable to the liquid crystal panel assembly 300 as shown in FIG. 22 and FIG. 23.

In a liquid crystal display including a pixels PX with a length in the row direction, the common voltage lines 176 are at the same layer as the data lines 171 and disposed substantially parallel to the data lines 171 such that the design of the various elements forming the pixel PX such as the line width and the structure of the common voltage lines 176 may be freely made in a liquid crystal display of the transflective type or the vertical alignment (VA) mode. Also, the common voltage lines 176 do not intersect the data lines 171 but intersect the gate lines 121 such that the signal delay due to the capacitive coupling between the common voltage lines 176 and the data line 171 may be substantially prevented, and electrical stability of the common voltage lines 176 may be gained.

Further, the common voltage lines 176 form the storage capacitors Cst along with the pixel electrodes 191 and the storage electrodes 137 receiving data voltages such that the capacitance of the storage capacitors Cst may be increased, and the area of the storage capacitors Cst may be reduced to thereby increase the aperture ratio.

Also, when the vertical alignment (VA) mode is applied, and inclination direction determining member such as cutouts or protrusions to determine the inclination direction of the liquid crystal molecules are formed in or on the pixel electrodes or the common electrode among the liquid crystal display including pixels PX with a length in the row direction, the common voltage line for forming the storage capacitor Cst may be formed to extend long in the column direction as in an exemplary embodiment of the present invention such that the design of the liquid crystal panel assembly may be freely made.

While this invention has been described in connection with what is presently considered to be practical exemplary embodiments, it is to be understood that the invention is not limited to disclosed embodiments, but, on the contrary, is intended to cover various modifications and equivalent arrangements included within the spirit and scope of the disclosure.

What is claimed is:

1. A liquid crystal display comprising:
a substrate;
a plurality of gate lines formed on the substrate;
a plurality of data lines intersecting the gate lines;
a plurality of common voltage lines formed in a layer of the liquid crystal display including the data line and substantially parallel to the data lines;
a plurality of thin film transistors connected to the gate lines and the data lines; and
a plurality of pixel electrodes respectively connected to the thin film transistors, arranged in a matrix shape, each of the plurality of pixels including a first edge substantially parallel to the gate lines and a second edge having a shorter length than the first edge and neighboring the first edge.

2. The liquid crystal display of claim 1, wherein the common voltage lines include an expansion electrode overlapping at least a portion of the pixel electrode.

3. The liquid crystal display of claim 2, wherein the expansion electrode overlaps a portion of one side of the pixel electrode.

4. The liquid crystal display of claim 2, wherein the expansion electrode overlaps an edge portion of the pixel electrode.

5. The liquid crystal display of claim 2, wherein a portion of the expansion electrode is disposed between the pixel electrode and a neighboring pixel electrode.

6. The liquid crystal display of claim 1, wherein the gate line transverses the pixel electrode in a row direction.

7. The liquid crystal display of claim 6, wherein the common voltage lines include a cover electrode covering a portion of the gate line.

8. The liquid crystal display of claim 1, further comprising a storage electrode formed in a layer of the liquid crystal display including the gate line, and receiving a data voltage from the thin film transistor.

9. The liquid crystal display of claim 8, wherein the common voltage lines include an expansion electrode simultaneously overlapping the storage electrode and the pixel electrode.

10. The liquid crystal display of claim 9, further comprising:
a gate insulating layer formed between the storage electrode and the common voltage lines; and
a passivation layer formed on the thin film transistor,
wherein the thin film transistor includes a gate electrode connected to the gate line, a source electrode connected to the data line, and a drain electrode connected to the pixel electrode.

11. The liquid crystal display of claim 10, wherein:
the gate insulating layer and the passivation layer include a first contact hole exposing a portion of the storage electrode;
the passivation layer includes a second contact hole exposing a portion of the drain electrode;
the pixel electrode receives the data voltage from the drain electrode through the second contact hole; and
the storage electrode receives the data voltage from the drain electrode through the first contact hole.

12. The liquid crystal display of claim 10, wherein:
the gate insulating layer includes a first contact hole exposing a portion of the storage electrode;
the passivation layer includes a second contact hole exposing a portion of the drain electrode and overlapping the first contact hole;
the pixel electrode receives the data voltage from the drain electrode through the second contact hole; and
the storage electrode receives the data voltage from the drain electrode through the first contact hole.

13. The liquid crystal display of claim 10, wherein:
the gate insulating layer and the passivation layer include a contact hole simultaneously exposing portions of the drain electrode and the storage electrode; and
the pixel electrode and the storage electrode receive the data voltage from the drain electrode through the contact hole.

14. The liquid crystal display of claim 1, further comprising
a gate driver connected to the gate lines.

15. The liquid crystal display of claim 14, wherein the gate driver includes a plurality of electrical elements disposed in a layer of the liquid crystal display including the gate lines, the data lines, and the thin film transistors.

16. The liquid crystal display of claim 1, further comprising:
a common electrode facing the pixel electrode,
wherein the pixel electrode comprises a transparent electrode; and
a reflective electrode formed on the transparent electrode and having an opening exposing the transparent electrode.

17. The liquid crystal display of claim 16, further comprising
a first passivation layer formed under the transparent electrode,
wherein the surfaces of the first passivation layer and the pixel electrode are uneven.

18. The liquid crystal display of claim 17, wherein the first passivation layer includes an organic material.

19. The liquid crystal display of claim 17, further comprising
a second passivation layer formed under the first passivation layer.

20. The liquid crystal display of claim 1, further comprising:
an upper substrate facing the substrate;
a common electrode formed on the upper substrate; and
a liquid crystal layer interposed between the substrate and the upper substrate, and including liquid crystal molecules,
wherein the pixel electrode or the common electrode includes an inclination direction determining member that determines an inclination direction of the liquid crystal molecules.

21. A method for manufacturing a liquid crystal display comprising:
forming a gate conductor including a gate line and a storage electrode on a substrate;
sequentially forming a gate insulating layer and a semiconductor layer on the gate conductor;
forming a data conductor including a data line, a drain electrode, and a common voltage line substantially parallel to the data line and intersecting the gate line on the semiconductor layer;
forming a passivation layer on the data conductor;
etching the passivation layer and the gate insulating layer to form at least one contact hole exposing the storage electrode and the drain electrode; and
forming a pixel electrode on the passivation layer.

22. The method of claim 21, wherein:

the contact hole includes a first contact hole exposing the storage electrode and a second contact hole exposing the drain electrode and being separate from the first contact hole;

the first contact hole is formed in the gate insulating layer; and the second contact hole is formed in the gate insulating layer and the passivation layer.

23. The method of claim 21, wherein:

the contact hole includes a first contact hole exposing the storage electrode and a second contact hole exposing the drain electrode and overlapping the first contact hole;

the first contact hole is formed in the gate insulating layer; and the second contact hole is formed in the passivation layer.

24. The method of claim 21, wherein the contact hole simultaneously exposes the storage electrode and the drain electrode.

25. The method of claim 21, wherein:

the forming of the passivation layer includes forming an organic layer to be uneven; and the forming of the pixel electrode includes forming a transparent electrode and forming a reflective electrode on the transparent electrode, wherein the reflective electrode exposes a portion of the transparent electrode.

* * * * *